(12) United States Patent
Do

(10) Patent No.: US 6,473,468 B1
(45) Date of Patent: Oct. 29, 2002

(54) DATA TRANSMISSION DEVICE

(75) Inventor: Chang Ho Do, Kyoungki-do (KR)

(73) Assignee: Hyundai Electronics Industries Co., Ltd., Ichon-shi (JP)

( * ) Notice: Subject to any disclaimer, the term of this patent is extended or adjusted under 35 U.S.C. 154(b) by 0 days.

(21) Appl. No.: 09/475,247

(22) Filed: Dec. 30, 1999

(30) Foreign Application Priority Data

Dec. 30, 1998 (KR) .............................................. 98-61880

(51) Int. Cl.[7] .................................................. G11C 7/00
(52) U.S. Cl. ........................ 375/285; 375/354; 327/142; 327/161; 365/189.05; 365/189.11; 365/194; 365/198; 365/206
(58) Field of Search ................................. 375/354, 259, 375/285; 327/142, 161; 365/189.05, 189.11, 194, 198, 206

(56) References Cited

U.S. PATENT DOCUMENTS

| | | |
|---|---|---|
| 5,384,552 A | 1/1995 | Iwasaki |
| 5,519,729 A | 5/1996 | Jurisch et al. |
| 5,526,332 A | 6/1996 | Yamada et al. |
| 5,657,361 A | 8/1997 | Inagaki et al. |
| 5,798,969 A * | 8/1998 | Yoo et al. .................... 326/57 |
| 5,917,353 A * | 6/1999 | Teel ............................ 327/176 |
| 6,329,857 B1 * | 12/2001 | Fletcher ...................... 327/215 |

* cited by examiner

Primary Examiner—Amanda T. Le
(74) Attorney, Agent, or Firm—Jacobson Holman PLLC

(57) ABSTRACT

The data transmission device including: a data bus sense amp controlled according to a control signal which is a pulse signal, for detecting and amplifying a data applied to a data bus; a plurality of driving units for buffering and outputting an output from the data bus sense amp; a read data line for receiving a pulse data transmitted by the plurality of driving units; a plurality of pull-down units controlled according to an output signal from the plurality of driving units, for performing a pull-down operation on the read data line; a plurality of multi-delay units controlled according to a detection signal detecting a period of an externally-inputted clock signal, for delaying the pulse data applied to the read data line for a different delay time; and a pull-up unit controlled according to an output signal from the plurality of multi-delay units, for resetting the data line. According to the data transmission device, a pulse width of the data line is controlled according to a clock period by using as a control signal an output signal from a pulse generating device in order to prevent a mis-operation in a high frequency operation, and reduce noise generation in a low frequency operation by differently controlling a pulse width of signals generated in the high and low frequency operations.

10 Claims, 16 Drawing Sheets

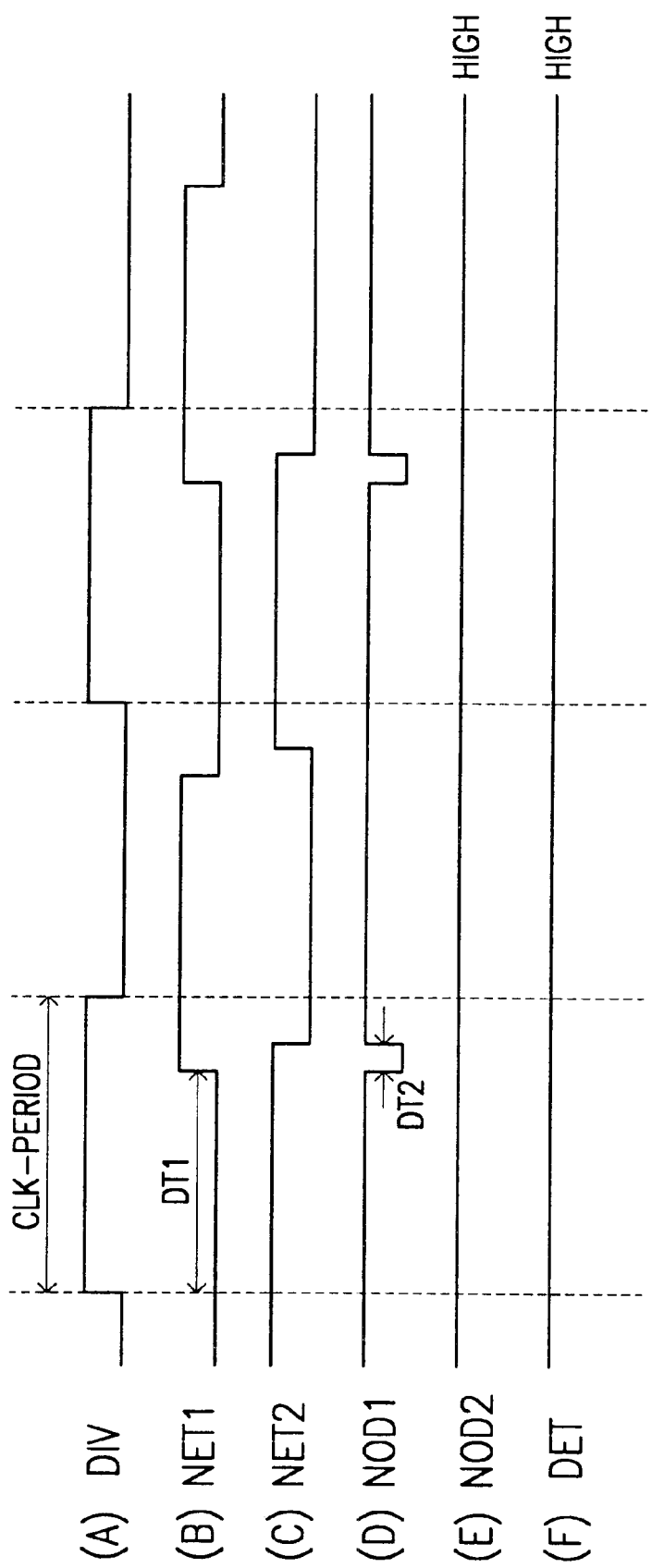

DATA TRANSMISSION DEVICE

BACKGROUND OF THE INVENTION

1. Field of the Invention

The present invention relates to a data transmission device using a pulse generating device, and in particular to an improved data transmission device which can prevent a mis-operation in a high speed operation, and reduce noise generation in a low speed operation, by detecting a period of an externally-inputted clock signal, and controlling a pulse width of a pulse signal generated in a device according to the period.

2. Description of the Background Art

In general, a synchronous dynamic random access memory (DRAM) controls an input/output of a data, synchronized with an externally-inputted clock signal CLK, and thus internal signals are regularly generated according to the clock signal.

FIG. 1 is a circuit diagram illustrating a conventional data transmission device. As shown therein, the data transmission device includes: a data bus line sense amp 2 operated according to a data sense amp enable signal EN which is a pulse signal having a predetermined pulse width; first and second inverters IN1, IN2 respectively inverting outputs from the data bus line sense amp 2; first and second pull-down drivers 4, 6 respectively performing a pull-down operation on read data lines RD, /RD according to outputs from the first and second inverters IN1, IN2; first and second delay units DE1, DE2 respectively delaying pulse data from the read data lines RD, /RD for a predetermined time; first and second pull-up drivers 8, 10 controlled according to outputs from the first and second delay units DE1, DE2, for respectively resetting the read data lines RD, /RD at a high level after a predetermined time from the time when the pulse data are applied to the read data lines RD, /RD; and a data output unit 12 buffering and externally outputting the data applied to the read data lines RD, /RD.

The data output unit 12 consists of a third inverter INV3 and a fourth inverter INV4 which are connected to the read data lines RD, /RD, respectively.

Here, the data bus sense amp enable signal EN which is an internal pulse signal having a predetermined pulse width is generated by a conventional pulse generating device as shown in FIG. 2a or 2b.

That is, the pulse generating device includes: a delay unit DE delaying the externally-inputted clock signal CLK for a predetermined time; and a NAND gate ND or a NOR gate NOR generating a pulse signal by NANDing or NORing an output signal from the delay unit DE and the clock signal CLK, thereby outputting an internal pulse signal EN having a predetermined pulse width.

However, a pulse width of a signal generated by the pulse generating device is determined according to the delay time of the delay unit DE, and thus the pulse generating device generates a pulse signal having a pulse width as long as the delay time.

The operation of the conventional data transmission device will now be explained.

The data applied to local data bus lines LDB, /LDB are inputted to the data bus line sense amp 2. When the data bus line sense amp 2 is operated according to the data bus line sense amp enable signal EN, and outputs an output signal, the pull-down drivers 4, 6 are driven by the output signal, thereby transmitting the pulse data to the read data lines RD, /RD.

The data applied to the read data lines RD, /RD drive the succeeding pull-up drivers 8, 10 after a predetermined delay time, thereby resetting the read data lines RD, /RD.

The conventional data transmission device has a disadvantage in that the delay time of the delay units DE1, DE2 controlling the pull-up drivers 8, 10 is fixed, and thus the pulse width of the pulse signal outputted through the read data lines RD, /RD is also fixed.

Accordingly, when the delay time is set longer in a high frequency operation, if data having an identical phase are consecutively inputted, a margin between two pulse data signals is not obtained, thus causing a mis-operation that the data line is not resetted.

In addition, in case the delay time is too short in a low frequency operation, although an operational speed is low, a large amount of current is consumed for a short time in the data transmission, and thus a noise is generated.

SUMMARY OF THE INVENTION

Accordingly, it is an object of the present invention to provide a data transmission device which can selectively transmit a data signal according to a high/low frequency by detecting a period of a clock signal, and receiving as a control signal an output signal from a pulse generating device controlling a pulse width according to the period.

In order to achieve the above-described object of the present invention, there is provided a data transmission device including: a data bus sense amp controlled according to a control signal which is a pulse signal, for detecting and amplifying a data applied to a data bus; a plurality of driving units for buffering and outputting an output from the data bus sense amp; a read data line receiving a pulse data transmitted by the plurality of driving units; a plurality of pull-down units controlled according to an output signal from the plurality of driving units, for performing a pull-down operation on the read data line; a plurality of multi-delay units controlled according to a detection signal detecting a period of an externally-inputted clock signal, for delaying the pulse data applied to the read data line for a different delay time; and a pull-up unit controlled according to an output signal from the plurality of multi-delay units, for resetting the data line.

BRIEF DESCRIPTION OF THE DRAWINGS

The present invention will become better understood with reference to the accompanying drawings which are given only by way of illustration and thus are not limitative of the present invention, wherein:

FIGS. 8a and 8b are operational timing diagrams of a clock period detector in the configuration of FIG. 7;

DETAILED DESCRIPTION OF THE PREFERRED EMBODIMENTS

Figure 1:
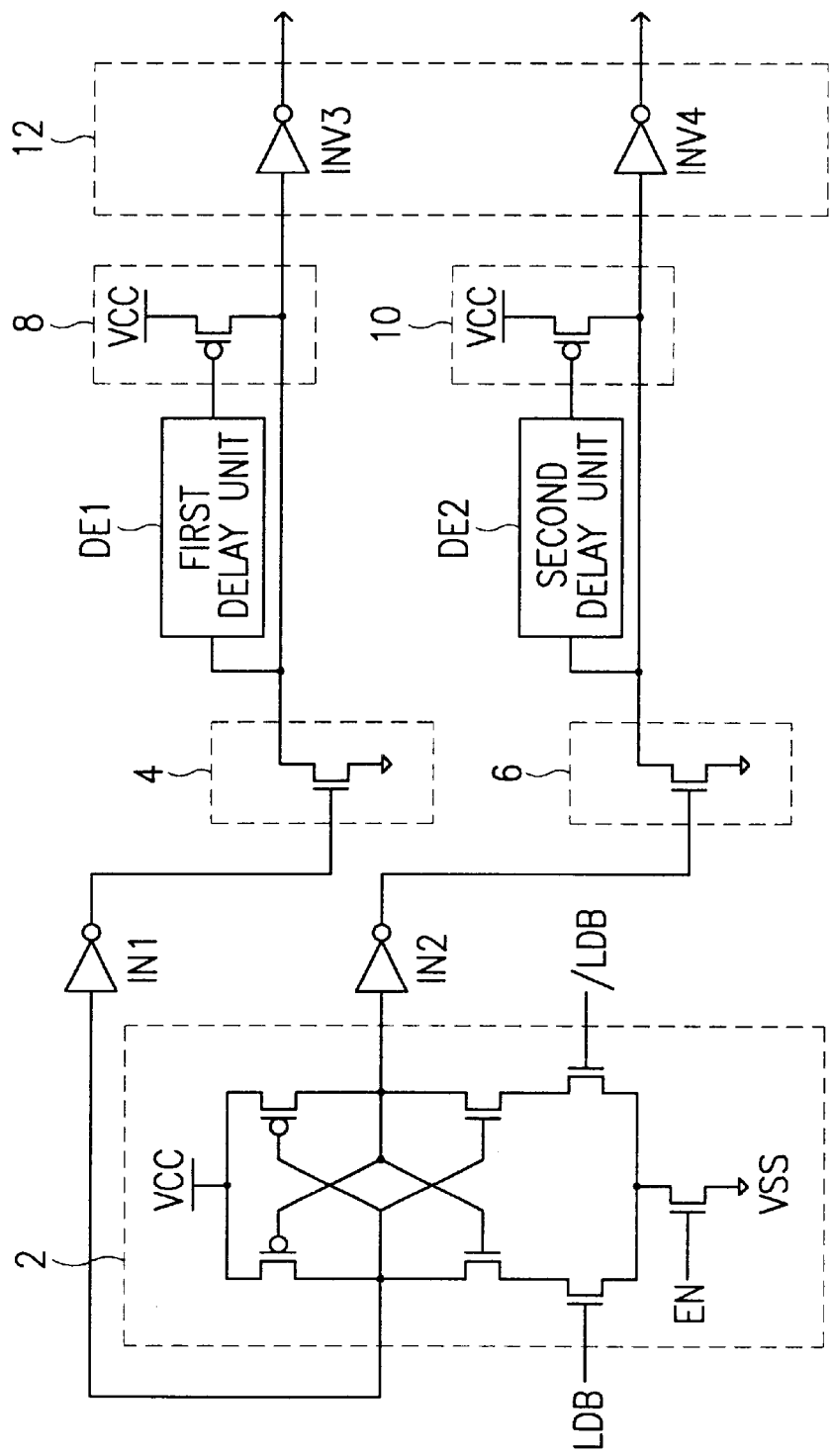
FIG. 1 is a circuit diagram illustrating a conventional data transmission device.
Figure 2A:
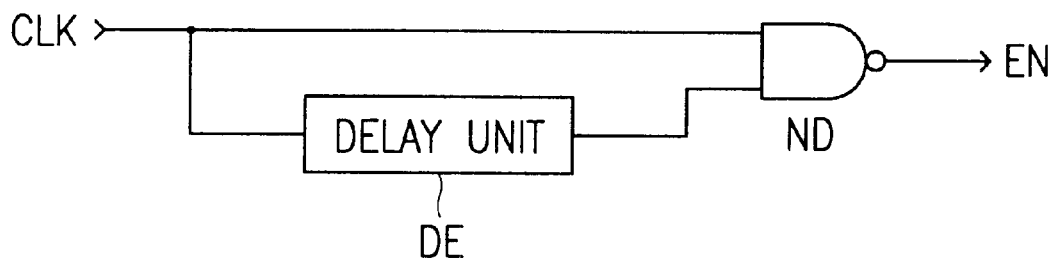
FIGS. 2a and 2b are circuit diagrams illustrating a conventional pulse generating device, respectively.
Figure 2B:
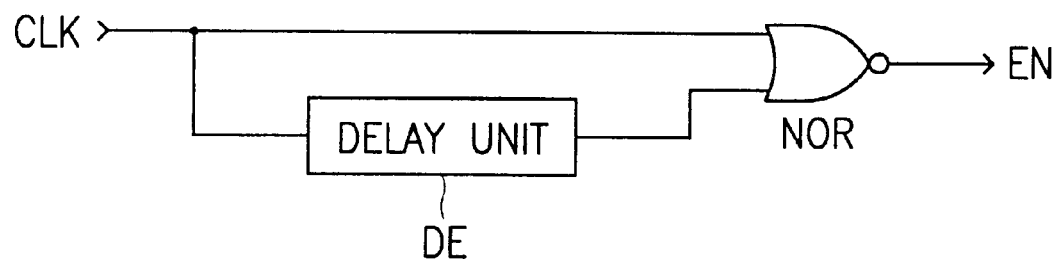
Figure 3:
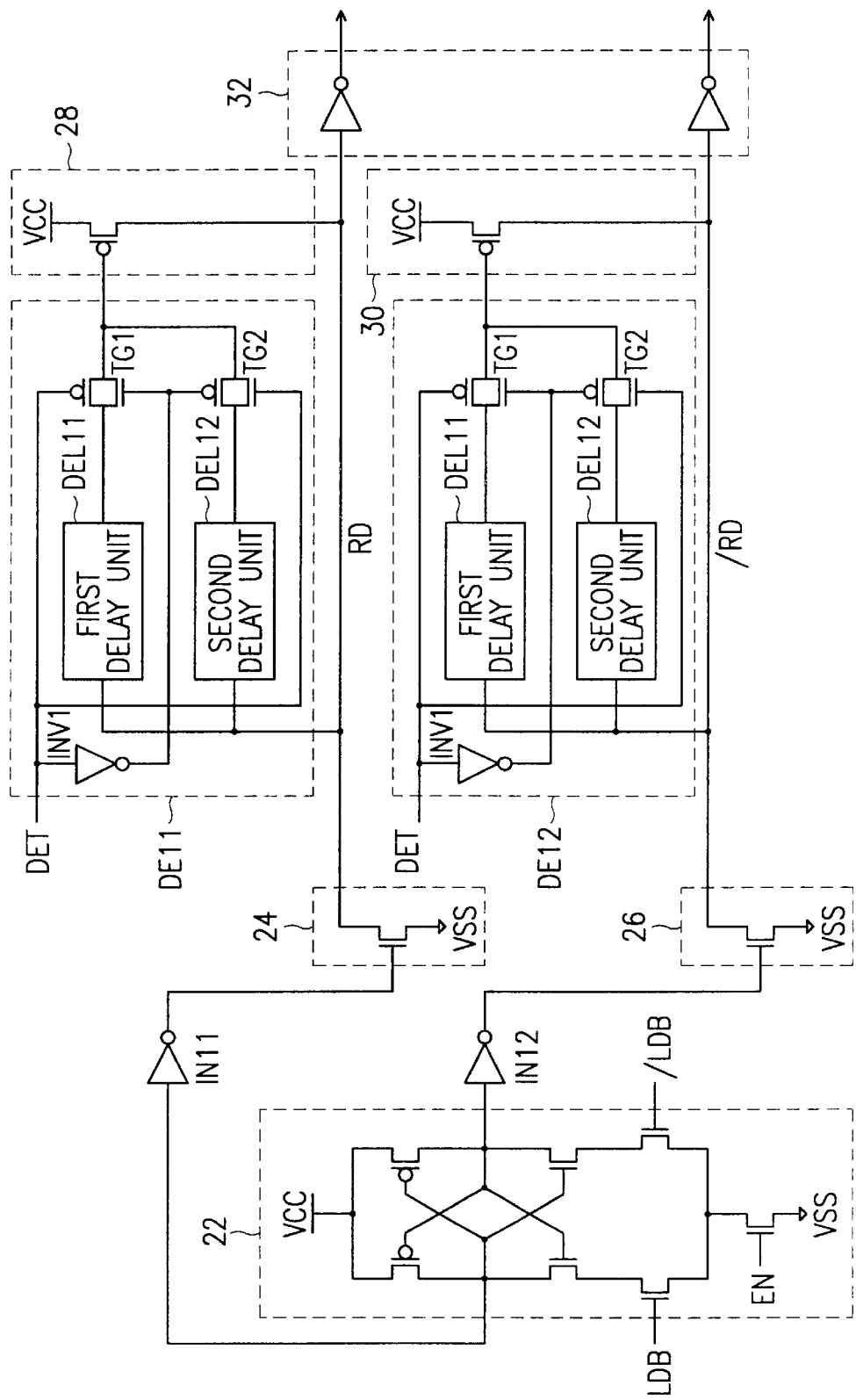
FIG. 3 is a circuit diagram illustrating a data transmission device in accordance with the present invention.

FIG. 3 is a detailed circuit diagram illustrating a data transmission device in accordance with the present invention. As shown therein, the data transmission device includes: a data bus line sense amp 22 controlled and operated according to a data sense amp enable signal CON which is a pulse signal; first and second inverters IN11, IN12 inverting potentials of each output terminal of the data bus line sense amp 22; pull-down drivers 24, 26 respectively performing a pull-down operation on read data lines RD, /RD according to outputs from the first and second inverters IN11, IN12; first and second delay units DE11, DE12 respectively delaying the data applied to the read data lines RD, /RD by controlling a delay time according to a control signal DET; pull-up drivers 28, 29 respectively controlled according to outputs from the first and second delay units DE11, DE12, for resetting the read data lines RD, /RD at a high level after a predetermined time from the time when a pulse data is applied to the read data lines RD, /RD; and a data output unit 32 buffering and externally outputting the data applied to the read data lines RD, /RD.

Here, the data bus line sense amp 22 is a general cross-coupled latch type sense amp, and thus an explanation thereof will be omitted.

The first and second delay units DE11, DE12 respectively include: first and second delay units DEL1, DEL2 respectively delaying the pulse data applied to the read data lines RD, /RD for a different delay time; and first and second transmission gates TG1, TG2 controlled according to the control signal DET and an inverted signal /DET of the control signal DET by the inverter INV1, for respectively selectively outputting the outputs from the first and second delay units DEL1, DEL2.

The first and second pull-up drivers 28, 29 respectively include first and second PMOS transistors PM1, PM2 controlled according to the outputs from the first and second transmission gates TG1, TG2 of the first and second delay units DEL1, DEL2, for resetting the read data lines RD, /RD at a high level by performing the pull-up operation thereon. In addition, the first and second pull-up drivers 28, 29 may include a PMOS transistor controlled according to a potential of a node which commonly connects the outputs from the first and second transmission gates TG1, TG2 of the first and second delay units DE11, DE12, for resetting the read data lines RD, /RD at a high level by carrying out the pull-up operation thereon.

Figure 4A:
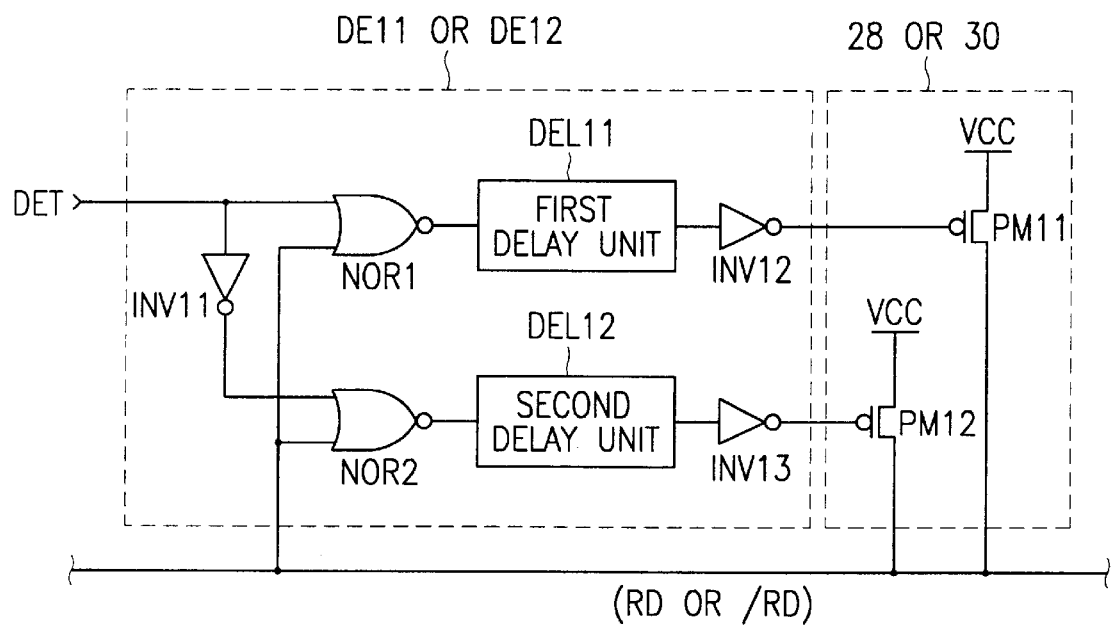
FIGS. 4a and 4b are detailed circuit diagrams respectively illustrating a multi-delay unit and a pull-up unit in accordance with the present invention.

FIG. 4a is a circuit diagram illustrating a second example of the first and second delay units DE11, DE12. As shown therein, the first and second delay units DE11, DE12 include: a first NOR gate NOR1 NORing the control signal DET and the pulse data applied to the read data lines RD, /RD; a second NOR gate NOR2 NORing the inverted signal /DET of the control signal DET by the first inverter INV11 and the pulse data applied to the read data lines RD, /RD; first and second delay units DEL11, DEL12 respectively delaying the outputs from the first and second NOR gates NOR1, NOR2 for a different time; and second and third inverters INV12, INV13 respectively inverting the outputs from the first and second delay units DEL11, DEL12.

Here, in case the example as shown in FIG. 4a is employed, the first and second pull-up drivers 28, 29 include first and second PMOS transistors MP11, MP12 respectively controlled according to the outputs from the first and second inverters INV12, INV13 of the delay unit DEL11, for resetting the read data lines RD, /RD at a power supply voltage VCC by the pull-up operation.

Figure 4B:
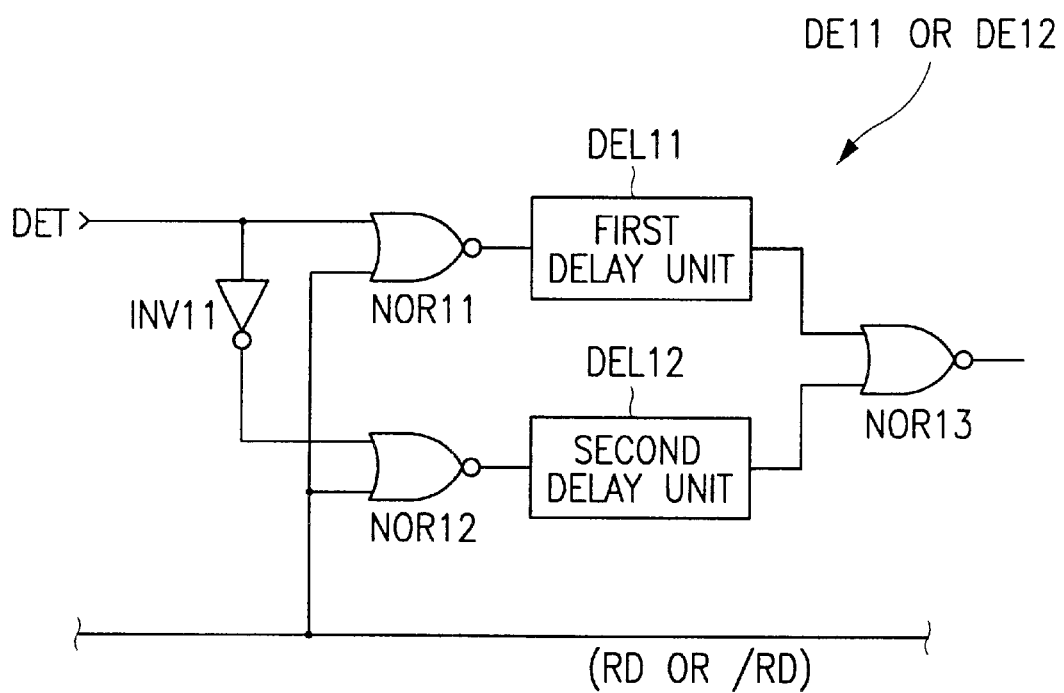

FIG. 4b is a circuit diagram illustrating a third example of the first and second delay units DE11, DE12. As shown therein, the first and second delay units DE11, DE12 include: a first NOR gate NOR11 NORing the control signal DET and the pulse data applied to the read data line RD; a second NOR gate NOR12 NORing the inverted signal /DET of the control signal DET by the first inverter INV11 and the pulse data applied to the read data line RD; first and second delay units DEL111, DEL112 respectively delaying the outputs from the first and second NOR gates NOR11, NOR12 for a different time; and a third NOR gate NOR13 NORing the outputs from the first and second delay units DEL111, DEL112.

The operation of the data transmission device in accordance with the present invention will now be explained.

Firstly, in a high frequency operation, a period of an externally-inputted clock signal is shorter than that of a reference clock signal. Thus, it is presumed that the control signal DET is at a low level. When the data bus line sense amp enable signal CON is applied, the pull-down driver 24 is driven, and thus the pulse data is applied to the data line. The pulse data signal passes through the first delay unit DEL1 having a relatively short delay time, and drives the pull-up drivers 28, 29 after a predetermined delay time DT1, thereby resetting the data lines RD, /RD.

Conversely, in a low frequency operation, a period of the externally-inputted clock signal is longer than that of the reference clock signal. Thus, it is presumed that the control signal DET is at a high level. When the data bus line sense amp enable signal CON is applied, in the same manner, the pull-up drivers 28, 29 are driven after a predetermined delay time DT2 according to a signal transmitted through the second delay unit DEL12 having a relatively long delay time DT2. At this time, the data lines are resetted.

As described above, a speed of resetting the data line is controlled according to the frequency, thereby narrowing the pulse width of the transmitted data signal in the high frequency operation, and widening it in the low frequency operation.

Figure 5A:
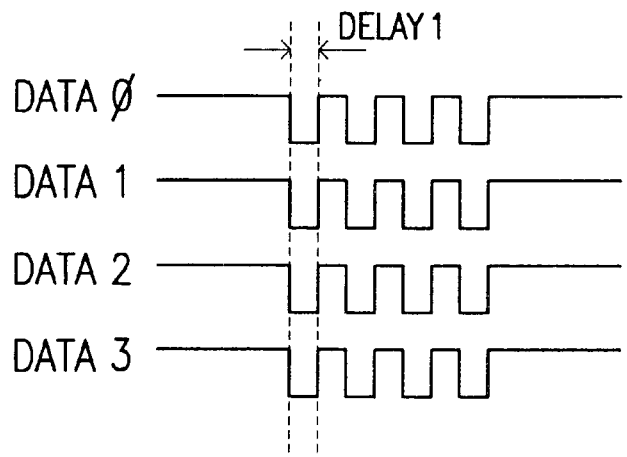
FIGS. 5a and 5b are operational timing diagrams of the data transmission device in accordance with the present invention, in a state where a data length is 4.
Figure 5B:
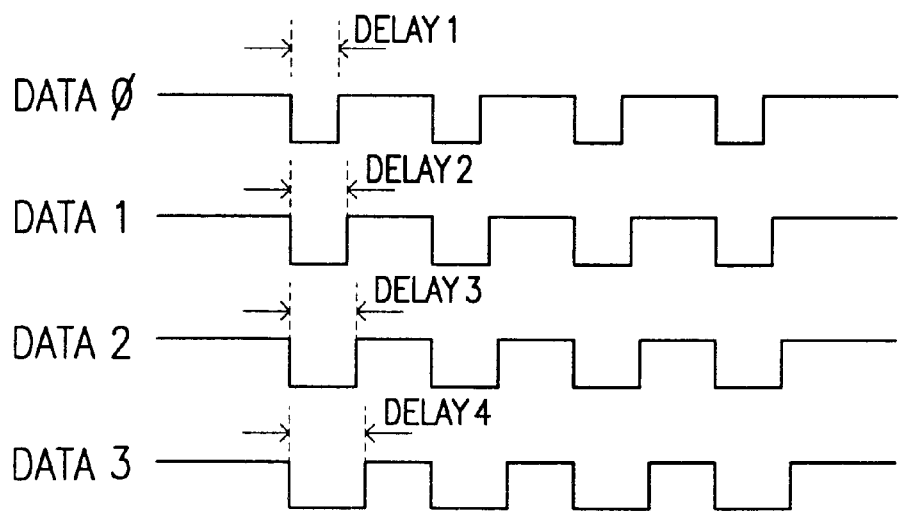

FIGS. 5a and 5b are operational timing diagrams of the data transmission device in accordance with the present invention, in a state where a data length is 4. The delay used by the data lines RD, /RD in the high speed operation is constantly fixed, and thus the data lines RD, /RD are operated to be resetted at the same time (FIG. 5a). In the low speed operation, the delay unit has a different delay time in regard to each data line, and thus the data lines are resetted at a different timing (FIG. 5b). As a result, a noise is reduced.

Figure 6:
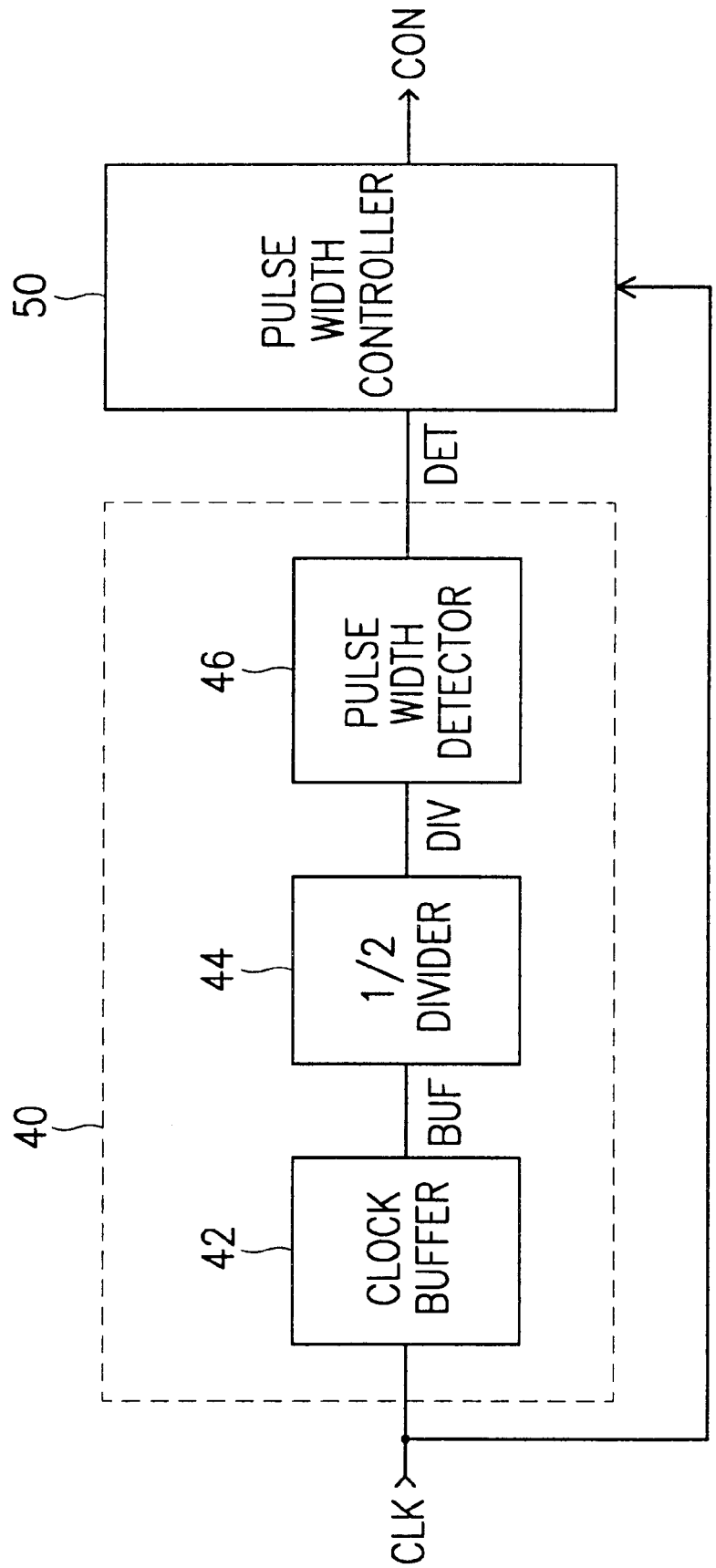
FIG. 6 is a detailed block diagram illustrating a clock period detector in the configuration of FIG. 3.

FIG. 6 is a detailed block diagram illustrating the clock period detector 40 generating the control signal DET. As shown therein, the clock period detector 40 includes: a clock buffer 42 buffering the externally-inputted clock signal having a transistor-transistor logic (TTL) level, and converting it into a signal BUF having a CMOS level suitable for an internal operation of the memory device; a ½ divider 44 generating a signal DIS having a double period of a period of the output signal BUF from the clock buffer 42; and a pulse width detector 46 controlled according to a power-up signal PWRUP, for comparing an output signal DIV from the ½ divider 44 with a reference pulse width, and outputting the detection signal DET detecting a pulse width of the output signal DIV from the ½ divider 44.

Here, the clock buffer 42 and the ½ divider 44 in the clock period detector 40 have been publicly known, and thus an explanation thereof will be omitted.

Figure 7:
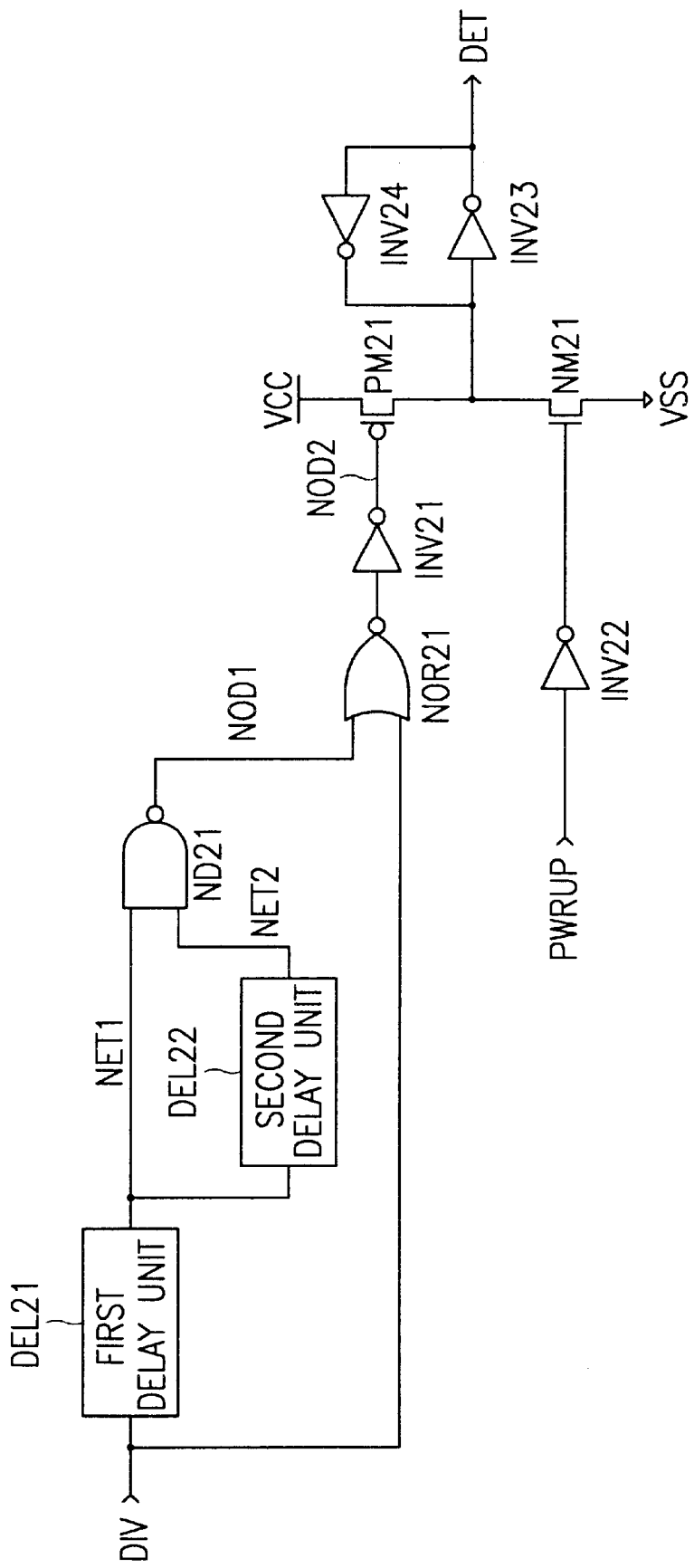
FIG. 7 is a circuit diagram illustrating a pulse width detector in the configuration of FIG. 6, in a state where a high frequency clock signal is inputted.

FIG. 7 is a circuit diagram illustrating the pulse width detector 46 used when the high frequency clock signal CLK is inputted. As shown therein, the pulse width detector. 46 includes: a first delay unit DEL21 delaying the output signal DIV from the ½ divider 44 for a predetermined time TD1; a second delay unit DEL22 delaying an output from the first delay unit DEL21 for a predetermined time TD2; a first NAND gate ND21 NANDing an output signal NET1 from the first delay unit DEL21 and an output signal NET2 from the second delay unit DEL22, and outputting a low enable pulse signal NOD1; a first NOR gate NOR21 NORing the output signal NOD1 from the first NAND gate ND21 and the output signal DIV from the ½ divider 44; a first inverter INV21 inverting an output from the first: NOR gate NOR21, and outputting a pulse signal NOD2; a second inverter INV22 inverting the power-up signal PWRUP; a first PMOS transistor PM21 and a first NMOS transistor NM21 respectively controlled according to the output signal NOD2 from the first inverter INV21 and an output signal from the second inverter INV22, and connected in series between the power supply voltage VCC and the ground voltage VSS; and third and fourth. inverters INV23, INV24 having their input/output terminals connected to output the detection signal DET by latching a potential at a commonly-connected drain of the first PMOS transistor PM21 and the first NMOS transistor NM21.

Figure 8A:
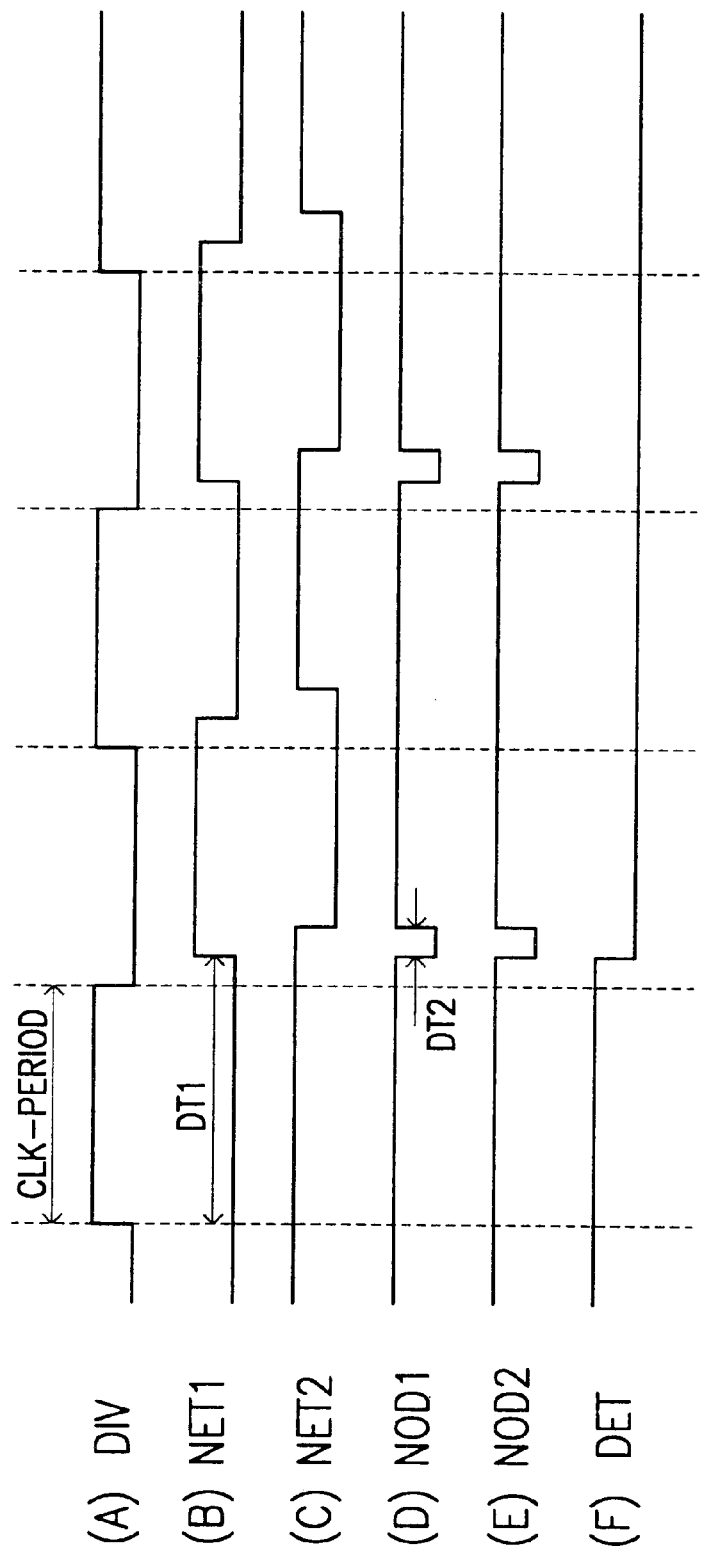

At this time, as illustrated in FIG. 8a, in the case that a high potential width of the output signal NOD1 from the first NAND gate ND21 of the pulse width detector 46 is smaller than a sum of the delay time TD1 of the first delay unit DEL21 and the delay time TD2 of the second delay unit DEL22, the output signal NOD2 from the first inverter INV1 is a low enable pulse signal identical to the output signal NOD1 from the first NAND gate ND1. Thereafter, the output signal DET from the pulse width detector 46 is transited from high to low because the output signal NOD2 from the first inverter INV21 which is the low enable pulse signal turns on the first PMOS transistor PM21, and supplies the power supply voltage to the third and fourth inverters INV23, INV24.

On the other hand, as shown in FIG. 8b, when a high potential width of the output signal NOD1 from the first NAND gate ND21 of the pulse width detector 46 is greater than the sum of the delay time TD1 of the first delay unit DEL21 and the delay time TD2 of the second delay unit DEL22, although the output signal NOD1 from the first NAND gate ND21 generates a low pulse, the output signal NOD2 from the first inverter INV21 maintains a high level because the output signal DIV from the ½ divider 44 constantly maintains a high level. Accordingly, the output signal DET from the pulse width detector 46 maintains a high level latched at an initial state.

Figure 9:
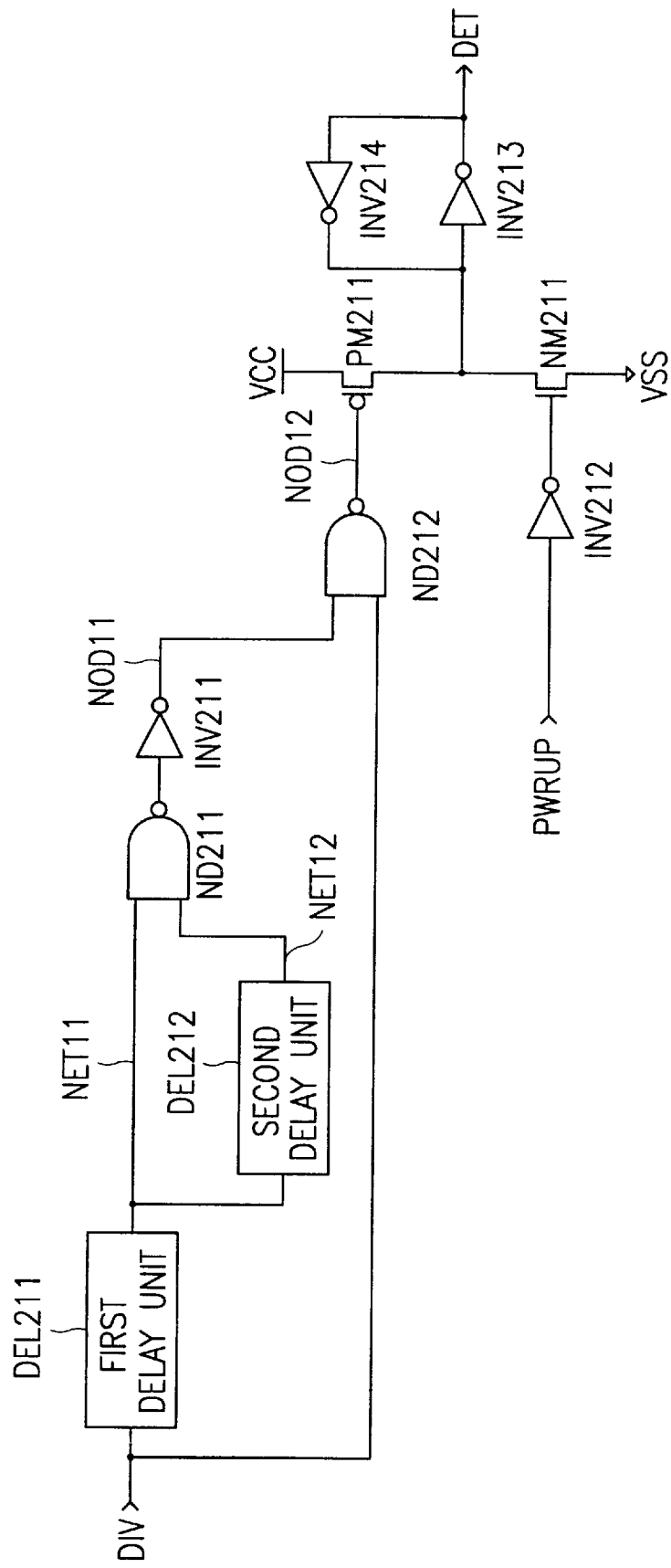
FIG. 9 is a circuit diagram illustrating the pulse width detector in the configuration of FIG. 6, in a state where a low frequency clock signal is inputted.

FIG. 9 is a circuit diagram illustrating another example of the pulse width detector 46 used when the low frequency clock signal CLK is inputted. As shown therein, the pulse width detector 46 includes: a first delay unit DEL211 delaying the output signal DIV from the ½ divider 44 for a predetermined time TD1; a second delay unit DEL212 delaying an output from the first delay unit DEL211 for a predetermined time TD2; a first NAND gate ND211 NANDing the output signal NET1 from the first delay unit DEL211 and the output signal NET2 from the second delay unit DEL212; a first inverter INV211 inverting an output from the NAND gate ND211, and outputting a high enable pulse signal NOD11; a second NAND gate ND212 NANDing the output signal NOD11 from the first inverter INV211 and the output signal DIV from the ½ divider 44, and outputting a pulse signal NOD12; a second inverter INV212 inverting the power-up signal PWRUP; a first PMOS transistor PM211 and a first NMOS transistor NM211 respectively controlled according to the output signal NOD12 from the second NAND gate NAND212 and an output signal from the second inverter INV212, and connected in series between the power supply voltage VCC and the ground voltage VSS; and third and fourth inverters INV213, INV214 having their input/output terminals connected to output the detection signal DET by latching a potential at a commonly-connected drain of the first PMOS transistor PM211 and the first NMOS transistor NM211.

Figure 10A:
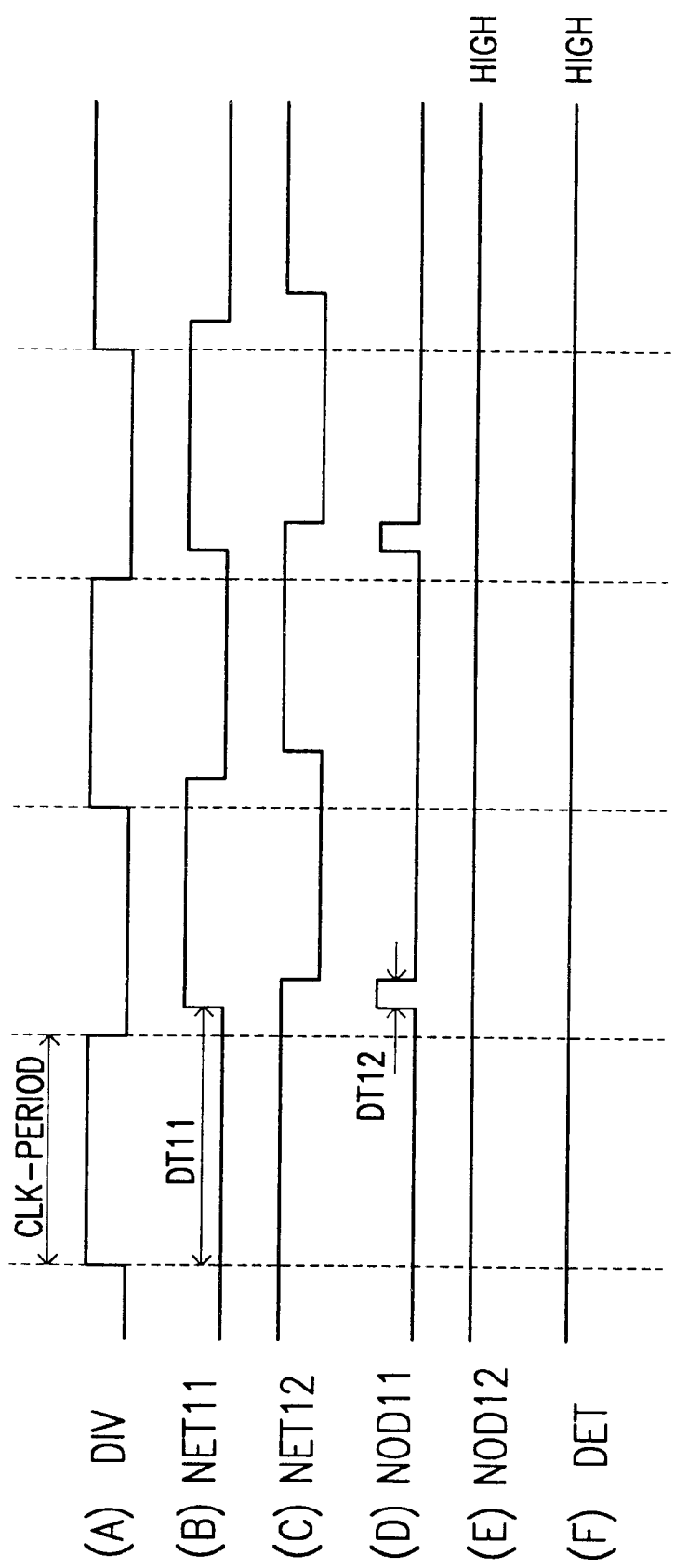
FIGS. 10a and 10b are operational timing diagrams of a clock period detector in the configuration of FIG. 9.

At this time, as depicted in FIG. 10a, in the case that a high potential width of the output signal NOD11 from the first inverter INV211 of another example of the pulse width detector 46 as shown in FIG. 9 is smaller than a sum of the delay time TD1 of the first delay unit DEL211 and the delay time TD2 of the second delay unit DEL212, although the output signal NOD11 from the first inverter INV211 generates a high pulse, the output signal NOD12 from the second NAND gate ND212 maintains a high level because the output signal DIV from the ½ divider 44 constantly maintains a high level. Accordingly, the output signal DET from the pulse width detector 46 maintains a high level latched at an initial state.

Figure 10B:
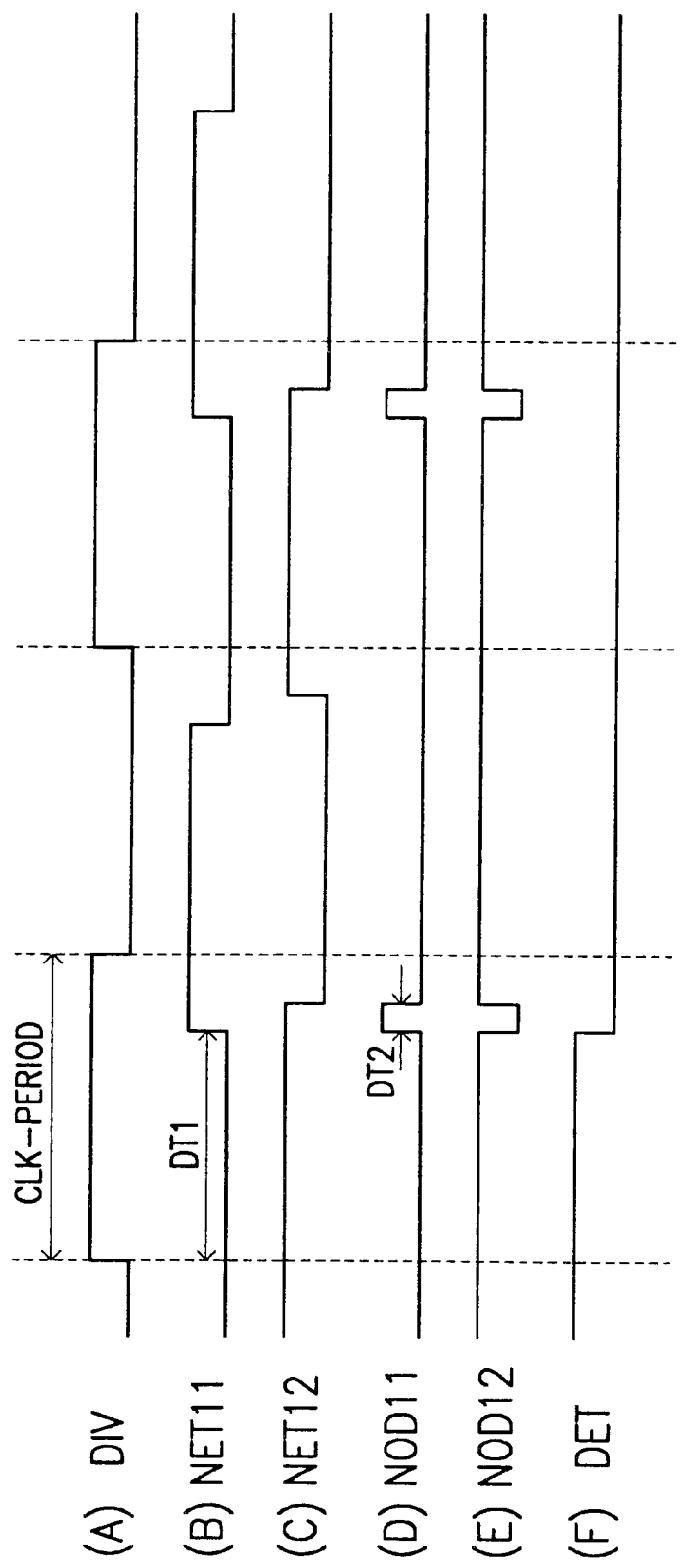

On the other hand, as shown in FIG. 10b, in case a high potential width of the output signal NOD11 from the first inverter INV211 of another example of the pulse width detector 46 as shown in FIG. 9 is greater than the sum of the delay time TD1 of the first delay unit DEL211 and the delay time TD2 of the second delay unit DEL212, the output signal NOD12 from the second NAND gate ND212 is a low enable pulse signal transited at an identical point to the output signal NOD11 from the first inverter INV211. Thereafter, the output signal NOD12 from the second NAND gate ND212 which is the low enable pulse signal turns on the first PNOS transistor PN21, thereby supplying the power supply voltage VCC to the third and fourth inverters INV213, INV214. As a result, the output signal DET from the pulse width detector 46 is transited from high to low.

Figure 11A:
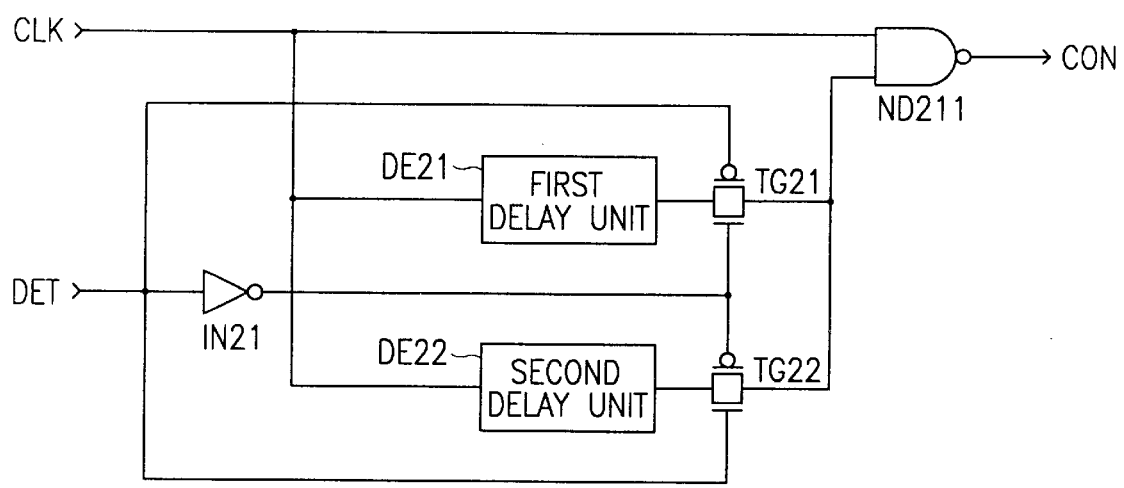
FIGS. 11a and 11c are detailed circuit diagrams illustrating examples of a pulse width controller in the configuration of FIG. 3.

FIG. 11a is a detailed circuit diagram illustrating a first example of the pulse width controller 50. As shown therein, the pulse width controller 50 includes: a first delay unit DE21 delaying the externally-inputted clock signal CLK for a predetermined time; a second delay unit DE22 delaying the clock signal CLK for a predetermined time; a first inverter IN21 inverting the output signal DET from the clock period detector 40; first and second transmission gates TG21, TG22 controlled according to the output signal DET from the clock period detector 40 and the inverted signal /DET thereof, for respectively selectively transmitting outputs from the first and second delay units DE21, DE22; and a NAND gate ND211 NANDing the input signal CLK and an output from the first delay unit DE21 or the second delay unit DE22 selectively transmitted by the first transmission gate TG21 or the second transmission gate TG22, and outputting the output signal CON.

Figure 11B:
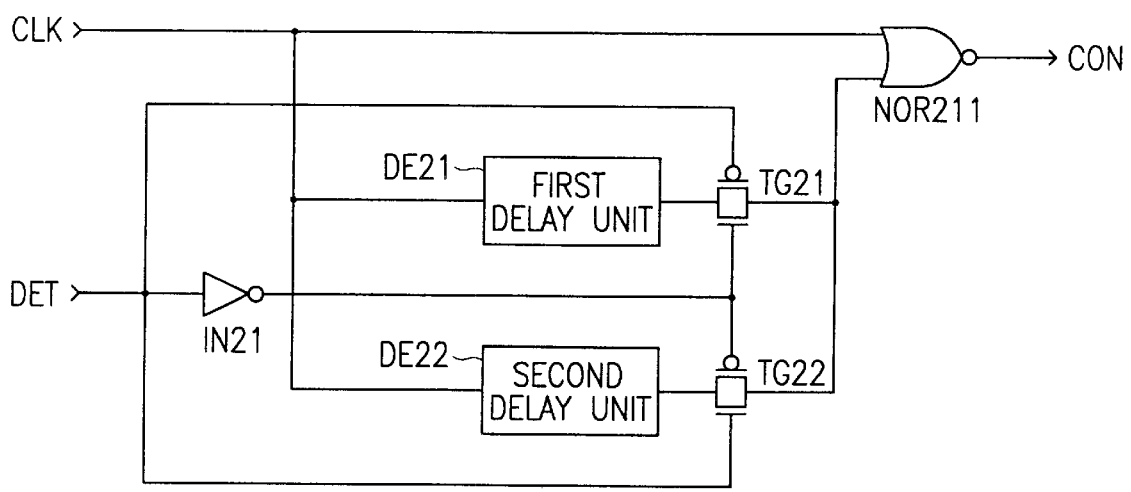

Here, as depicted in FIG. 11b, the NAND gate ND211 may be replaced by a NOR gate NOR221.

The pulse width controller 50 selectively transmits the two outputs from the delay unit having a different delay time by employing the transmission gate controlled according to the output signal DET from the clock period detector 40. Accordingly, the pulse width can be selectively used by distinguishing whether the period of the externally-inputted clock signal CLK is longer or shorter than that of the reference clock signal.

Figure 11C:
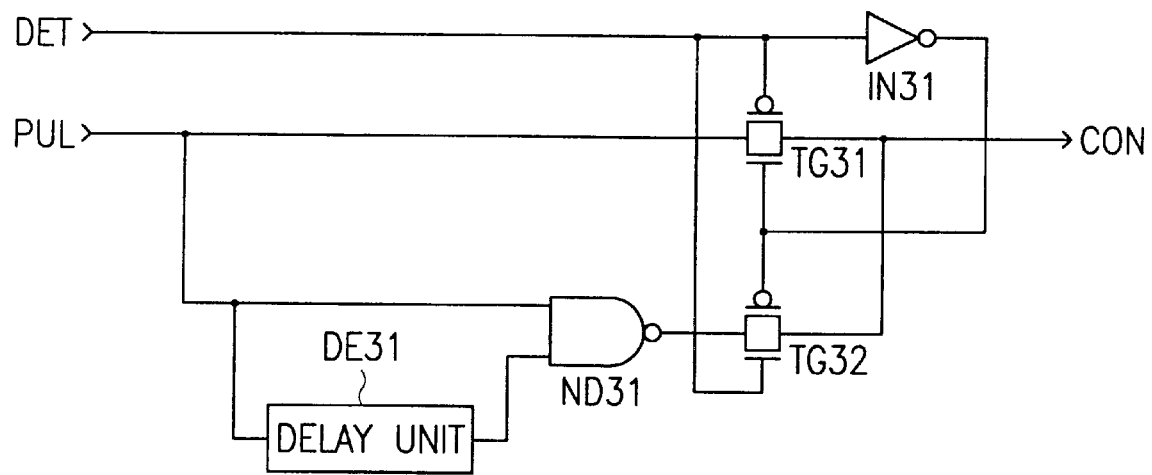

In addition, FIG. 11c illustrates another example of the pulse width controller 50. A pulse signal PUL that has been already generated in the semiconductor memory device is employed, and therefore the pulse width can be selectively used by distinguishing whether the period of the externally-inputted clock signal CLK is longer or shorter than that of the reference clock signal. As shown therein, the pulse width controller 50 includes: a delay unit DE31 delaying the pulse signal PUL that has already been generated inside for a predetermined time; a NAND gate ND31 NANDing an output from the delay unit DE31 and the pulse signal PUL; and first and second transmission gates TG31, TG32 controlled according to the output signal DET from the clock period detector 40 and the inverted signal /DET thereof, for respectively selectively transmitting the pulse signal PUL and an output from the NAND gate ND31, and outputting the output signal CON.

As discussed earlier, in accordance with the present invention, the data transmission device using the pulse generating device controls the pulse width of the signal according to the period of the externally-inputted clock signal, thereby reducing possibility of a mis-operation in the high frequency operation, preventing excessive current consumption in the low frequency operation, and minimizing noise generation.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A data transmission device comprising:
   a data bus sense amp controlled according to a control signal which is a pulse signal, for detecting and amplifying a data applied to a data bus;
   a plurality of driving units for buffering and outputting an output from the data bus sense amp;
   a read data line for receiving a pulse data transmitted by the plurality of driving units;
   a plurality of pull-down units controlled according to an output signal from the plurality of driving units, for performing a pull-down operation on the read data line;
   a plurality of multi-delay units controlled according to a detection signal detecting a period of an externally-inputted clock signal, for delaying the pulse data applied to the read data line for a different delay time; and
   a pull-up unit controlled according to an output signal from the plurality of multi-delay units, for resetting the data line.

2. The data transmission device according to claim 1, wherein each of the plurality of multi-delay units comprises:
   a plurality of delay units for respectively delaying the pulse data applied to the read data line for a different delay time; and
   a plurality of transmission gates controlled according to the control signal and an inverted signal of the control signal, for respectively selectively outputting the outputs from the plurality of delay units.

3. The data transmission device according to claim 1, wherein each of the plurality of multi-delay units comprises:
   a first NOR gate for NORing the control signal and the pulse data applied to the read data line;
   a second NOR gate for NORing the inverted signal of the control signal and the pulse data applied to the read data line;
   first and second delay units for respectively delaying outputs from the first and second NOR gates for a different time; and
   first and second inverters for respectively inverting outputs from the first and second delay units; and
   the pull-up unit comprises: first and second PMOS transistors controlled according to the outputs from the first and second inverters of the multi-delay unit, for resetting the read data line at a high level by the pull-up operation.

4. The data transmission device according to claim 1, wherein each of the plurality of multi-delay unit comprises:
   first NOR gate for NORing the control signal and the pulse data applied to the read data line;
   a second NOR gate for NORing the inverted signal of the control signal and the pulse data applied to the read data line;
   first and second delay units for respectively delaying the outputs from the first and second NOR gates for a different time; and
   a third NOR for NORing the outputs from the first and second delay units.

5. The data transmission device according to claim 1, wherein the detection signal is outputted from a clock period detector for detecting a period of an externally-inputted clock signal, comparing it with a reference pulse width, and outputting a comparison result, the clock period detector comprises:
   a clock buffer for buffering the externally-inputted clock signal having a transistor-transistor logic level, and converting it into a signal having a CMOS level suitable for an internal operation of the memory device;
   a divider for generating a signal having a period which is a few times as long as a period of the output signal from the clock buffer; and
   a pulse width detector for comparing an output signal of the divider with the reference pulse width, and outputting a detection signal detecting a pulse width of the output signal from the divider.

6. The data transmission device according to claim 5, wherein the pulse width detector comprises:
   a first delay unit for delaying the output signal from the divider for a predetermined time in order to output a detection signal transited when a frequency over a predetermined frequency is inputted, in case a high frequency clock signal is inputted;
   a second delay unit for delaying an output from the first delay unit for a predetermined time;

a first NAND gate for NANDing an output signal from the first delay unit and an output signal from the second delay unit, and outputting a low enable pulse signal;

a first NOR gate for NORing the output signal from the first NAND gate and the output signal from the divider;

a first inverter for inverting an output from the first NOR gate, and outputting a pulse signal;

a second inverter for inverting a reference clock signal;

a PMOS transistor and an NMOS transistor respectively controlled according to the output signal from the first inverter and the output signal from the second inverter, and connected in series between the power supply voltage and the ground voltage; and third and fourth inverters having their input/output terminals connected to output the detection signal by latching a potential at a commonly-connected drain of the PMOS transistor and the NMOS transistor.

7. The data transmission device according to claim 5, wherein the pulse width detector comprises:

a first delay unit for delaying the output signal from the divider for a predetermined time in order to output a detection signal transited when a frequency below a predetermined frequency is inputted, in case a low frequency clock signal is inputted;

a second delay unit for delaying an output from the first delay unit for a predetermined time;

a first NAND gate for NANDing the output signal from the first delay unit and the output signal from the second delay unit;

a first inverter for inverting an output from the NAND gate, and outputting a high enable pulse signal;

a second NAND gate for NANDing the output signal from the first inverter and the output signal from the divider, and outputting a pulse signal;

a second inverter for inverting a reference clock signal;

a PMOS transistor and an NMOS transistor respectively controlled according to the output signal from the second NAND gate and the output signal from the second inverter, and connected in series between the power supply voltage and the ground voltage; and third and fourth inverters having their input/output terminals connected to output the detection signal by latching a potential at a commonly-connected drain of the PMOS transistor and the NMOS transistor.

8. The data transmission device according to claim 1, wherein the control signal is outputted from a pulse width controller controlled according to the detection signal, and controlling and outputting a pulse width of the externally-inputted clock signal, the pulse width controller comprises:

a first delay unit for delaying the externally-inputted clock signal for a predetermined time;

a second delay unit for delaying the clock signal for a predetermined time different from the delay time of the first delay unit;

a first inverter for inverting the output signal from the clock period detector;

first and second transmission gates controlled according to the output signal from the clock period detector and the inverted signal thereof, for respectively selectively transmitting outputs from the first and second delay units; and a NAND gate for NANDing the clock signal and an output from the first delay unit or the second delay unit selectively transmitted by the first transmission gate or the second transmission gate, and outputting an output signal.

9. The data transmission device according to claim 8, wherein the pulse width controller comprises:

a first delay unit for delaying the externally-inputted clock signal for a predetermined time;

a second delay unit for delaying the clock signal for a predetermined time different from the delay time of the first delay unit;

a first inverter for inverting the output signal from the clock period detector;

first and second transmission gates controlled according to the output signal from the clock period detector and the inverted signal thereof, for respectively selectively transmitting outputs from the first and second delay units; and a NOR gate for NORing the clock signal and an output from the first delay unit or the second delay unit selectively transmitted by the first transmission gate or the second transmission gate, and outputting an output signal.

10. The data transmission device according to claim 8, wherein the pulse width controller comprises:

a delay unit for delaying a pulse signal that has already been generated in the semiconductor memory device for a predetermined time;

a NAND gate for NANDing an output from the delay unit and the pulse signal; and first and second transmission gates controlled according to the output signal from the clock period detector and the inverted signal thereof, for respectively selectively transmitting the pulse signal and an output from the NAND gate, and outputting an output signal.

* * * * *